(12) United States Patent
Dwyer et al.

(10) Patent No.: US 12,715,763 B2
(45) Date of Patent: Aug. 25, 2026

(54) ACCELEROMETER WITH THERMAL EXPANSION STRAIN PROTECTION

(71) Applicant: Honeywell International Inc., Charlotte, NC (US)

(72) Inventors: Paul W. Dwyer, Seattle, WA (US); Stephen F. Becka, Nampa, ID (US)

(73) Assignee: Honeywell International Inc., Charlotte, NC (US)

( * ) Notice: Subject to any disclaimer, the term of this patent is extended or adjusted under 35 U.S.C. 154(b) by 495 days.

(21) Appl. No.: 18/332,598

(22) Filed: Jun. 9, 2023

(65) Prior Publication Data

US 2024/0409394 A1 Dec. 12, 2024

(51) Int. Cl.
*B81B 7/00* (2006.01)
*G01P 1/02* (2006.01)
*G01P 15/13* (2006.01)

(52) U.S. Cl.
CPC ............ *B81B 7/0019* (2013.01); *G01P 1/023* (2013.01); *G01P 15/132* (2013.01); *B81B 2201/0235* (2013.01)

(58) Field of Classification Search
CPC .................................. G01P 1/02; G01P 1/023
See application file for complete search history.

(56) References Cited

U.S. PATENT DOCUMENTS 4,854,169 A * 8/1989 Sakuma ................ G01P 15/132 73/431
6,040,625 A 3/2000 Ip
6,073,490 A 6/2000 Konovalov et al.
6,912,902 B2 7/2005 Malametz et al.
7,482,193 B2 1/2009 Dcamp et al.
8,418,554 B2 4/2013 Joyce
8,610,222 B2 12/2013 Lin et al.
9,156,673 B2 10/2015 Bryzek et al.
9,625,489 B2 4/2017 Ullrich et al.
9,856,132 B2 1/2018 Bryzek et al.
9,869,796 B2 1/2018 Pike et al.
10,167,189 B2 1/2019 Zhang et al.
10,209,072 B2 2/2019 Stephanou et al.
10,274,512 B2 4/2019 Tocchio et al.
10,330,696 B2 6/2019 Bulatowicz et al.

(Continued)

OTHER PUBLICATIONS

An et al., "Die-Attach Structure of Silicon-on-Glass MEMS Devices Considering Asymmetric Packaging Stress and Thermal Stress", Sensors, vol. 19, No. 18, Retrieved from: https://www.mdpi.com/1424-8220/19/18/3979, Sep. 14, 2019, 13 pp.

(Continued)

*Primary Examiner* — Walter L Lindsay, Jr.
*Assistant Examiner* — Andrew V Do
(74) *Attorney, Agent, or Firm* — Shumaker & Sieffert, P.A.

(57) ABSTRACT

An accelerometer includes an enclosure coupled to one or more mechanical interposers. The interposers are configured to couple the enclosure to a magnetic assembly and the magnetic assembly is configured to couple to a proof mass. The accelerometer may include electrical circuitry having a torquer coil coupled to the proof mass, where the electrical circuitry may be configured to generate an electrical signal based on an acceleration of the accelerometer. Orienting the coupling of the of the enclosure to the magnetic assembly, temperature strain on the accelerometer may be relieved.

20 Claims, 4 Drawing Sheets

(56) References Cited

U.S. PATENT DOCUMENTS

| | | | |
|---|---|---|---|
| 10,352,960 | B1 | 7/2019 | Shcheglov et al. |
| 10,591,507 | B2 | 3/2020 | Tocchio et al. |
| 11,312,619 | B1 | 4/2022 | English et al. |
| 2018/0252739 | A1 | 9/2018 | Malvern |

OTHER PUBLICATIONS

Jia et al., "A Novel Packaged Ultra-High Q Silicon MEMS Butterfly Vibratory Gyroscope", Micromachines, vol. 13, Retrieved from: https://www.mdpi.com/2072-666X/13/11/1967/pdf, Nov. 13, 2022, 14 pp.

Wang et al., "Micromachined Accelerometers with Sub-µg/vHz Noise Floor: A Review", Sensors, vol. 20, No. 14, Retrieved from: https://www.mdpi.com/1424-8220/20/14/4054, Jul. 21, 2020, 36 pp.

* cited by examiner

ACCELEROMETER WITH THERMAL EXPANSION STRAIN PROTECTION

TECHNICAL FIELD

This disclosure relates to accelerometers and accelerometer electronics.

BACKGROUND

Aerospace applications depend on accurately measuring acceleration in various directions. An accelerometer is a type of device that may be used to accurately measure acceleration for such aerospace applications. An accelerometer is an electro-mechanical motion device that produces varying electrical signals in the presence of varying acceleration forces applied to the device, with the electrical signals being indicative of the acceleration experienced by the device.

SUMMARY

In general, this disclosure is directed to techniques for improving thermal expansion strain protection within an accelerometer. Accelerometers may be used in various environmental conditions for determining an acceleration and producing an electrical signal indicative of a value that acceleration. When used in aerospace applications, an accelerometer may undergo changing environmental conditions including fluctuating temperatures. In the presence of fluctuating temperatures, components and materials of an accelerometer may undergo thermal expansion. The amount of thermal expansion a material undergoes may be expressed by the thermal coefficient of expansion (TCE) for the material. Thermal expansion of two or more adjacent components with varying TCE values may induce thermal strain resulting from fluctuating temperatures.

When an accelerometer includes components manufactured from various materials having different TCE values, fluctuating temperatures may induce thermal strain within the accelerometer. For examples, an enclosure of an accelerometer may be sealed to a component of the accelerometer used in measuring an acceleration value. In the presence of fluctuating temperatures, expansion of the enclosure may cause strain on measurement components of the accelerometer. The strain on the measurement components may result in inaccurate electrical signals leading to inaccurate measurements.

In one example, an accelerometer including a first enclosure piece having an inner face coupled, using a first mechanical interposer, to an outer face of a first magnetic assembly piece, wherein the first enclosure piece is a monolithic structure. The accelerometer also includes a second enclosure piece having an inner face coupled, using a second mechanical interposer, to an outer face of a second magnetic assembly piece. The second enclosure piece of the accelerometer being a monolithic structure. The accelerometer also including a proof mass, having a proximal face, coupled to a distal face of the first enclosure piece forming a first joint, the proof mass may include a distal face coupled to a proximal face of the second enclosure piece forming a second joint. A mechanical bond of the accelerometer formed across the first joint and the second joint. An electrical circuitry of the accelerometer includes torquer coil coupled to the proof mass, configured to generate an electrical signal based on an acceleration of the accelerometer.

In one example, a method for manufacturing an accelerometer, may include coupling, using a first mechanical interposer, an inner face of a first enclosure piece to an outer face of a first magnetic assembly piece. The first enclosure piece of the accelerometer being a monolithic structure. The method may also include coupling, using a second mechanical interposer, an inner face of a second enclosure piece to an outer face of a second magnetic assembly piece, wherein the second enclosure piece is a monolithic structure. The method including forming, by coupling a proximal face of a proof mass to a distal face of the first enclosure piece, a first joint. The method including forming, by coupling a distal face of the proof mass to a proximal face of the second enclosure piece, a second joint. The method also including forming, across the first joint and the second joint, a mechanical bond; wherein the mechanical bond comprises a first bond formed using laser welding across the first joint, and a second bond formed using laser welding across the second joint. The method also including coupling, to a torquer coil of an electrical circuitry, the proof mass configured to induce an electrical signal based on an acceleration of the accelerometer.

Details of these and other examples are set forth in the accompanying drawings and the description below. Other features, objects, and advantages will be apparent from the description and drawings, and from the claims.

DETAILED DESCRIPTION

Figure 1:
FIG. 1 is a conceptual three-dimensional drawing illustrating an example of an accelerometer configured to relieve thermal strain, in accordance with one or more techniques of this disclosure.
Figure 1:
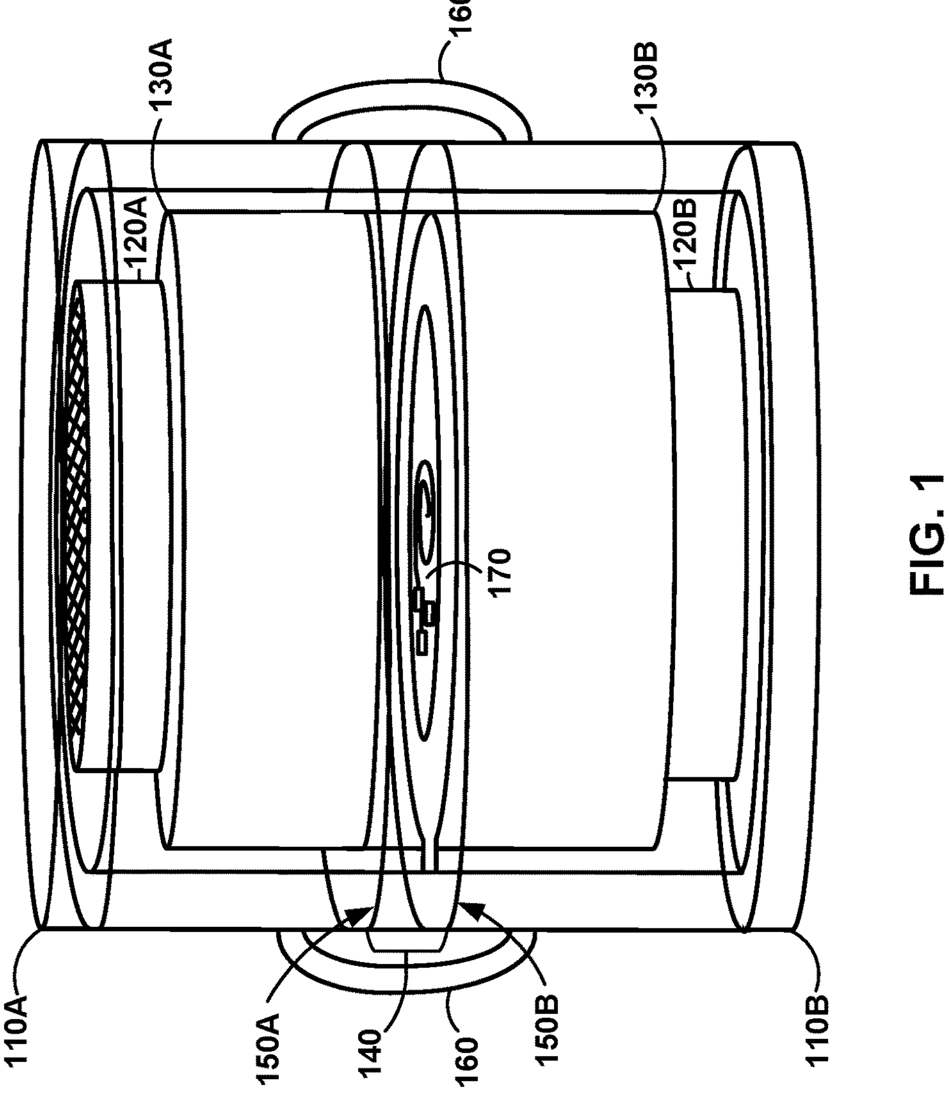

Accelerometers are devices that detect acceleration in one or more axes over a duration of time. Accelerometers may rely on the location and/or movement of internal mechanical components to measure an acceleration of the device. The accelerometer may transmit a measured acceleration value by generating an electrical signal. The electrical signal generated by the accelerometer may be further processed by external circuitry, such as processors or other such circuitry, to determine the measured acceleration value. An accelerometer may, for example, include a proof mass piece, and the electrical signal may be indicative of a movement of the proof mass and/or a force needed to prevent movement of the proof mass piece, which is in turn indicative of an acceleration experienced by the accelerometer. Unintended variation in the location and movement of the mechanical components may generate measurement errors. For instance, when used in avionics applications strains over temperature in accelerometer devices contribute to errors in navigation. These errors may create variation in the accuracy of the avionics system.

In some examples, removing the source of strain applied to the accelerometer, such as the proof mass, may reduce errors generated by the accelerometer. For example, strain induced between a difference in TCE values between a magnetic assembly (e.g., magnetic return path) and a proof mass, may be mitigated with one or more techniques of this disclosure. Using two or more different materials having different TCE values may result in unintended mechanical strains, during changing temperature conditions. For instance, a first material, for example Invar, may be used on a component of the accelerometer that is adjacent to another component made of a second material, for example, fused quartz. The first material may have a first TCE value that is substantially different from the TCE value of the second material. When the temperature of the accelerometer increases, the material with the larger TCE value may expand more than the material with the smaller TCE value. The greater expanding material may mechanically compress or contort the lesser expanding material, resulting in mechanical strain. The mechanical strain induced by changing temperatures may be referred to as thermal strain. Changing temperatures may cause the two materials to flex, bend, or buckle.

In some examples, the thermal strain caused by the differences in TCE values may affect measurement components of the accelerometer. When measurement components, for example the proof mass, are impacted by thermal strain, the electrical signal generated by the accelerometer may be distorted or noisy. While materials with different TCE values, such as fused quartz and invar, have characteristics that may be useful in accelerometers, the risk of thermal strain may be detrimental for certain use conditions. Techniques for utilizing these materials in an accelerometer while limiting thermal strain in the presence of changing temperatures is described herein.

FIG. 1 is a conceptual three-dimensional drawing illustrating an example accelerometer system 100 configured to relieve thermal strain, in accordance with one or more techniques of this disclosure. As illustrated in the example of FIG. 1, system 100 may include a first enclosure piece 110A, a second enclosure piece 110B, a first mechanical interposer 120A, a second mechanical interposer 120B, a first magnetic assembly piece 130A, a second magnetic assembly piece 130B, a proof mass 140, a mechanical bond 160, and electrical circuitry 170.

In some examples, first enclosure piece 110A and second enclosure piece 110B may be monolithic structures. First enclosure piece 110A and second enclosure piece 110B (collectively "enclosure 110") may be configured to enclose components of the accelerometer. For example, first enclosure piece 110A and second enclosure piece 110B may each have a cylindrical cup structure. First enclosure piece 110A may include a proximal end that forms a base of the cup structure defined by first enclosure piece 110A. A proximal end of second enclosure piece 110B may include a circular rim of the cup structure defined by second enclosure piece 110B. First enclosure piece 110A may include a distal end that forms the circular rim of the cup structure defined by first enclosure piece 110A. A distal end of second enclosure piece 110B may be defined by a base of the cup structure defined by second enclosure piece 110B. First enclosure piece 110A and second enclosure piece 110B may each include an inner face and an outer face. The inner face may include any face or portion of a face on a concave portion of the cup structure. The outer face may include any face or portion of a face on a convex portion of the cup structure.

Using a monolithic structure for enclosure 110, improves the resilience of the accelerometer to temperature strain. Temperature strain may be limited by using materials with similar or the same TCE values. Temperature may be further limited by using material, such as fused quartz, having a low TCE value. Temperature strain induced in joints between enclosure 110 and proof mass 140, may be limited by orienting the joints distal to first magnetic assembly piece 130 and second magnetic assembly piece 110B. Arranging components, made from materials with significantly high TCE values, near enclosure 110, may increase the susceptibility of the accelerometer to errors from temperature strain. For example, directly coupling first magnetic assembly piece 130A and second magnetic assembly piece 110B to proof mass 140 may significantly increase the susceptibility of the accelerometer to temperature induced errors.

In some examples, first magnetic assembly piece 130 and second magnetic assembly piece 110B (collectively "magnetic assembly 110") may each form cylindrical cup structures. The inner face of first enclosure piece 110A may be coupled, using first mechanical interposer 120A, to the outer face of first magnetic assembly piece 130A. Second enclosure 110B may be coupled, using second mechanical interposer 120B, to the outer face of second magnetic assembly piece 130B. Magnetic assembly 110 may be supported by first mechanical interposer 120A and second mechanical interposer 120B. First mechanical interposer 120A and second mechanical interposer 120B may provide stress relief by transferring stress to a location remote from proof mass 140. While enclosure 110 may be used to transfer the location of the stress, magnetic assembly 110 may provide magnetic fields in proximity to the coils to produce the Lorentz force for servo loop closure.

An outer face of first magnetic assembly piece 130A may include any face or portion of a face on a concave portion of the cup structure defined by first magnetic assembly piece 130A. An outer face of second magnetic assembly piece 130 may include any face or portion of a face on a concave portion of the cup structure defined by second magnetic assembly piece 130B. An inner face of first magnetic assembly piece 130A may include any face or portion of a face on a convex portion of the cup structure defined by first magnetic assembly piece 130A. An inner face of second magnetic assembly piece 130B may include any face or portion of a face on a convex portion of the cup structure defined by second magnetic assembly piece 130B.

Enclosure 110 may be configured to enclose a first magnetic assembly piece 130A, and a second magnetically assembly piece (collectively "magnetic assembly 130") by coupling enclosure 110 to proof mass 140. For example, proof mass 140, having a proximal face, may be coupled to the distal face of first enclosure piece 110A forming a first joint 150A. Proof mass 140 having a distal face, may be coupled to the proximal face of second enclosure piece 110B forming a second joint 150B. An outside ring of proof mass 140 may form first joint 150A with first enclosure piece 110A, and second joint 150B with second enclosure piece 110B. In some examples, a mechanical bond may be formed across first joint 150A and the second joint 150B. In some examples, first joint 150A and second joint 150B may be bonded with a quartz-to-quartz laser welding. In some examples, quartz-to-quartz laser welding may be performed with a similar laser used in selective laser-induced etching (SLE) techniques.

Coupling enclosure 110 to proof mass 140 also protects some electrical circuitry of the accelerometer from damage. For examples, electrical circuitry, including a torquer coil, may be coupled to the proof mass. In some examples, the electrical circuitry may be oriented on a middle portion of the proof mass, mechanically coupled to the ring of the proof mass by one or more flexures. Coupling enclosure 110 to proof mass 140, (e.g., the ring of proof mass 140) allows the movement of magnetic assembly 130 to be isolated from temperature strain introduced by enclosure 110.

The electrical circuitry may be configured to generate an electrical signal based on an acceleration experienced by accelerometer system 100. For example, in some configurations accelerometer system 100 may include a force rebalance accelerometer, in which the electrical signal corresponds to an amount of current needed to produce a magnetic field that prevents displacement of proof mass 140 in the presence of an acceleration. That is, the electrical signal may correspond to an amount of current needed to rebalance proof mass 140 to a null position in the presence of acceleration. Alternatively or additionally, accelerometer system 100 may include a capacitive accelerometer, in which the electrical signal corresponds to a change of capacitance in a capacitive gap between proof mass 140 and another capacitor plate. Regardless of the accelerometer sensing technology, or combination of technologies, used, the electrical signal generally refers to any electrical signal from which processing circuitry, either included in accelerometer system 100 or external to accelerometer system 100, can determine an acceleration value.

Figure 2:
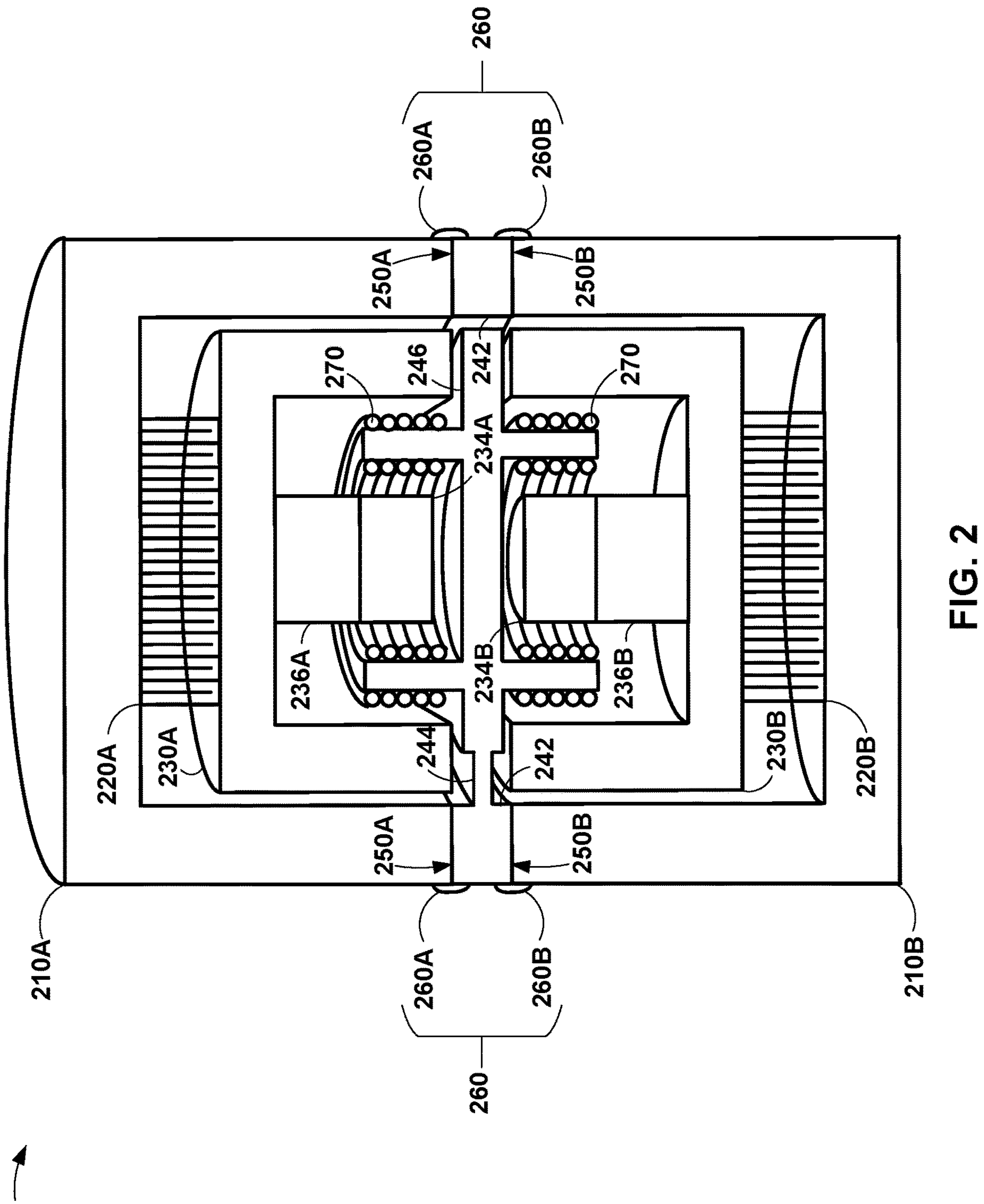
FIG. 2 is a conceptual three-dimensional drawing illustrating an example of an accelerometer having a torquer coil inside thermal strain resistant enclosure, in accordance with one or more techniques of this disclosure.

FIG. 2 is a conceptual three-dimensional drawing illustrating an example of a system 200 for measuring acceleration using a torquer coil 270 inside a thermal strain resistant enclosure 210, in accordance with one or more techniques of this disclosure. As illustrated in the example of system 200 of FIG. 2, system 200 may have similar features to those illustrated in system 100 of FIG. 1. For example, system 200 may include a first enclosure piece 210A, a second enclosure piece 210B (collectively "enclosure 210"). System 200 may also include a first magnetic assembly piece 230A, a second magnetic assembly piece 230B (collectively "magnetic assembly 230"). As illustrated in the example, system 200 may also include a first mechanical interposer 220A, a second mechanical interposer 220B, a proof mass 240, a mechanical bond 260, and electrical circuitry. Additionally, or alternatively system 200, as illustrated in FIG. 2 may include a first magnet 236A, a second magnet 236B, a first pole piece 234A, a second pole piece 234B, torquer coil 270, a ring 242 of the proof mass, a flexure 244 of the proof mass, a first bond joint 260A of mechanical bond 260 and a second bond joint 260B of mechanical bond 260.

In some examples, an inside face of first enclosure piece 210A may be mechanically coupled to an outside face of first magnetic assembly piece 230A, via first interposer 220A. An inside face of second enclosure piece 210B may be mechanically coupled to an outside face of second magnetic assembly piece 230B. First interposer 220A and second interposer 220B may be structures configured to dampen mechanical movement induced by enclosure 210. For example, first interposer 220A and second interposer 220B may include a dampening mechanism configured to absorb compression forces from enclosure 210 caused by thermal strain. In some examples, thermal strain induced between enclosure 210 and mechanical bond 260 may be absorbed by first interposer 220A and second interposer 220B.

In various examples, enclosure 210 may mechanically couple to ring 242 of the proof mass via first bond joint 260A and second bond joint 260B. Ring 242 may be connected to a middle portion of the proof mass via a flexure 244. Flexure 244 may mechanically connect ring 242 to a central portion, including accelerometer electronics such as torquer coil 270. The middle portion of the proof mass, including torquer coil 270, may be oriented so as to magnetically couple to first pole piece 234A and second pole piece 234B while not physically contacting any part of magnetic assembly 230.

Figure 3:
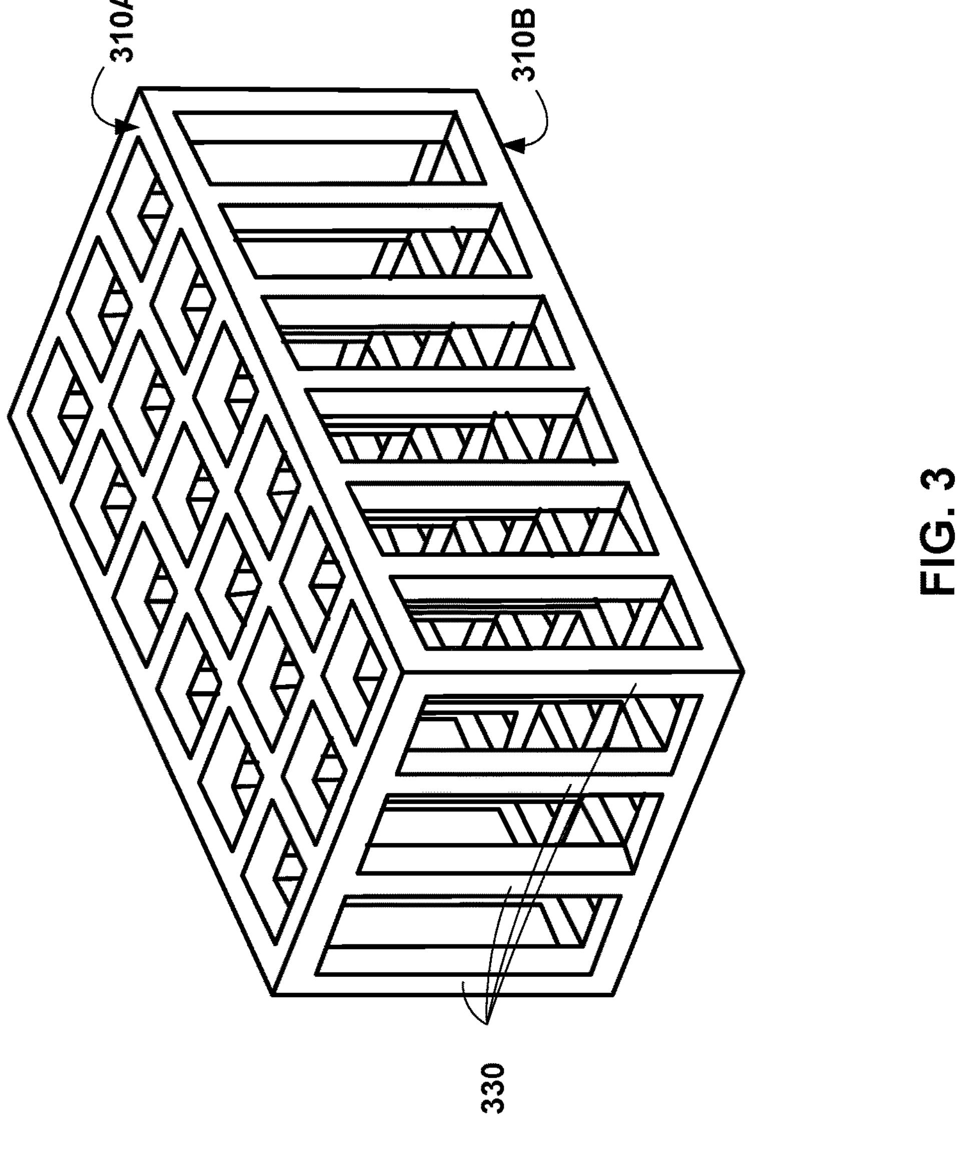
FIG. 3 is a conceptual drawing of a three-dimensional cross-sectional drawing illustrating an example of an interposer used in an accelerometer, in accordance with one or more techniques of this disclosure.

First pole piece 234A and second pole piece 234B may be oriented to direct magnetic fields produced by first magnet 236A and second magnet 236B through an aperture of torquer coil 270. Acceleration forces applied to accelerometer system 200, may cause middle portion 246 of proof mass to flex or bend about flexure 244 in relation to ring 242. Electrical circuitry may generate an electrical signal based on the orientation of middle portion 246 with respect to first magnetic assembly 230A and second magnetic assembly 230B. For example, electrical circuitry may compare a quantity of magnetic fields coupled to torquer coil 270 from first magnet 236A to a quantity of magnetic fields coupled to torquer coil 270 from second magnet 236B. In some examples, electrical circuitry may apply a current to torquer coil 270 to center middle portion 246 between first magnetic assembly piece 230A and second magnetic assembly piece 230B. Electrical circuitry may also apply a current to offset assembly biases or gravitational calibration biases. First interposer 220A and second interposer 220B may FIG. 3 is a conceptual three-dimensional cross-sectional drawing illustrating an example of an interposer 300 used in an accelerometer, in accordance with one or more techniques of this disclosure. Interposer 300 is an example implementation of interposers 120A, 120B, 220A, and 220B described above. As illustrated in the example of FIG. 3, interposer 300 may include a first side 310A connected to a second side 310B via a plurality of pillar structures 330.

In some examples, pillar structures 330 may function as a dampening mechanism of interposer 300. For example, pillar structures 330 may be configured to bend or flex when a compression force is applied between first side 310A and second side 310B. Thermal strain transferred to interposer 300 from the enclosure of an accelerometer may be absorbed by pillar structures 330. For example, pillar structures 330 may absorb thermal strain by bending as compression is applied between first face 310A and second face 310B.

Interposer 300 may be a quartz interposer incorporated into the quartz assembly. In some examples, the quartz interposer may be manufactured as a monolithic structure that includes enclosure 110. Alternatively, interposer 300 may be manufactured separately from enclosure 110 and bonded to enclosure 110.

In some examples, interposer 300 may be manufactured as a monolithic structure, from fused quartz, including enclosure 110. For example, a single piece of fused quartz may be manufactured to form the cup structure of either first enclosure 110A or second enclosure piece 110B. An inside wall of the enclosure piece may be etched using selective laser-induced etching (SLE) techniques.

In another example, interposer 300 may be manufactured separately and bonded to quartz assembly 110 using one or more mechanical bonding techniques. For example, a first piece of fused quartz may be manufactured into interposer 300 and a second piece of fused quartz may be manufactured into first enclosure piece 110A or second enclosure piece 110B. Interposer 300 may be bonded, with epoxy, to either first enclosure piece 110A, or second enclosure piece 110B. In some examples, interposer 300 may be bonded to either first enclosure piece 110A, or second enclosure piece 110B via laser welding techniques. In some examples, epoxy may include an epoxy having a low TCE value (e.g., a value like the TCE value of quartz).

Pillar structures 330, of an interposer incorporated with assembly 110 or of interposer manufactured separately from assembly 110, may be formed by using one or more SLE techniques. The one or more SLE techniques may be used to remove fused quartz from around each pillar of the pillar structures 330. In some examples, a first plurality of holes may be etched into a top side of interposer 300, as second plurality of holes may be etched into a first lateral side of interposer 300, and a third plurality of holes may be etched into a second lateral side of interposer 300. Etching, with one or more SLE techniques, the first plurality of holes the second plurality of holes, and the third plurality of holes, may generate pillar structures 330.

Pillar structures 330 may provide the enclosure 110 of FIG. 1 with the dampening mechanism used to isolate magnetic assembly 130 from mechanical strain of enclosure 110. Bending, flexing, or straining of enclosure 110 may be isolated from magnetic assembly 130 by bending one or more pillar structures 330. Pillar structures 330 may also provide electrical isolation between electrical traces integrated on individual pillar structures. For example, insulative material, or gas (e.g., air, or nitrogen gas) may be present between pillars of pillar structures 330. In some examples, a first electrical trace integrated on one or more sides of a first pillar structure may be electrically isolated from a second electrical trace integrated on one or more sides of a second pillar structure. Electrically connecting pins to electrical traces on pillar structures 330, may produce electrical connection points for interconnecting external and internal circuitry. For example, internal circuitry such as electrical circuitry 170 may be electrically coupled to external circuitry for processing electrical signals generated by electrical circuitry 170 via pillar structures 330.

Electrical connections may be included in interposer 300 by incorporating glass-to-metal seals or epoxy joints to a fused quartz substrate of interposer 300. For example, conductive electrical connections may be incorporated into pillar structures 330, allowing electrical signals to be conducted from first side 310A to second side 310B. Conductive traces connected to proof mass 140 of FIG. 1 may be bonded (e.g., wire bonded or soldered) to first side 310A of interposer 300. Electrical connections may connect electrical traces on proof mass 140 to electrical circuitry 170. Second side 310B of interposer 300 may be bonded (e.g., wire bonded) to conductive traces on enclosure 110. Similar bonding techniques may be used on first interposer 220A and first assembly piece 110A as are used on second interposer 220A and second assembly piece 220B.

In some examples, gold-plated pins may be used as conductive traces to transfer electrical signals from first side 310A of interposer 330 to second side 310B of interposer 330. The gold-plated pins may be epoxied to a portion of magnetic assembly 130 and electrically bonded (e.g., wire bonded or soldered) to proof mass 140. The end of the gold-plated pins may be configured as a socket to interface with electrical pins included in electrical circuitry 170.

Figure 4:
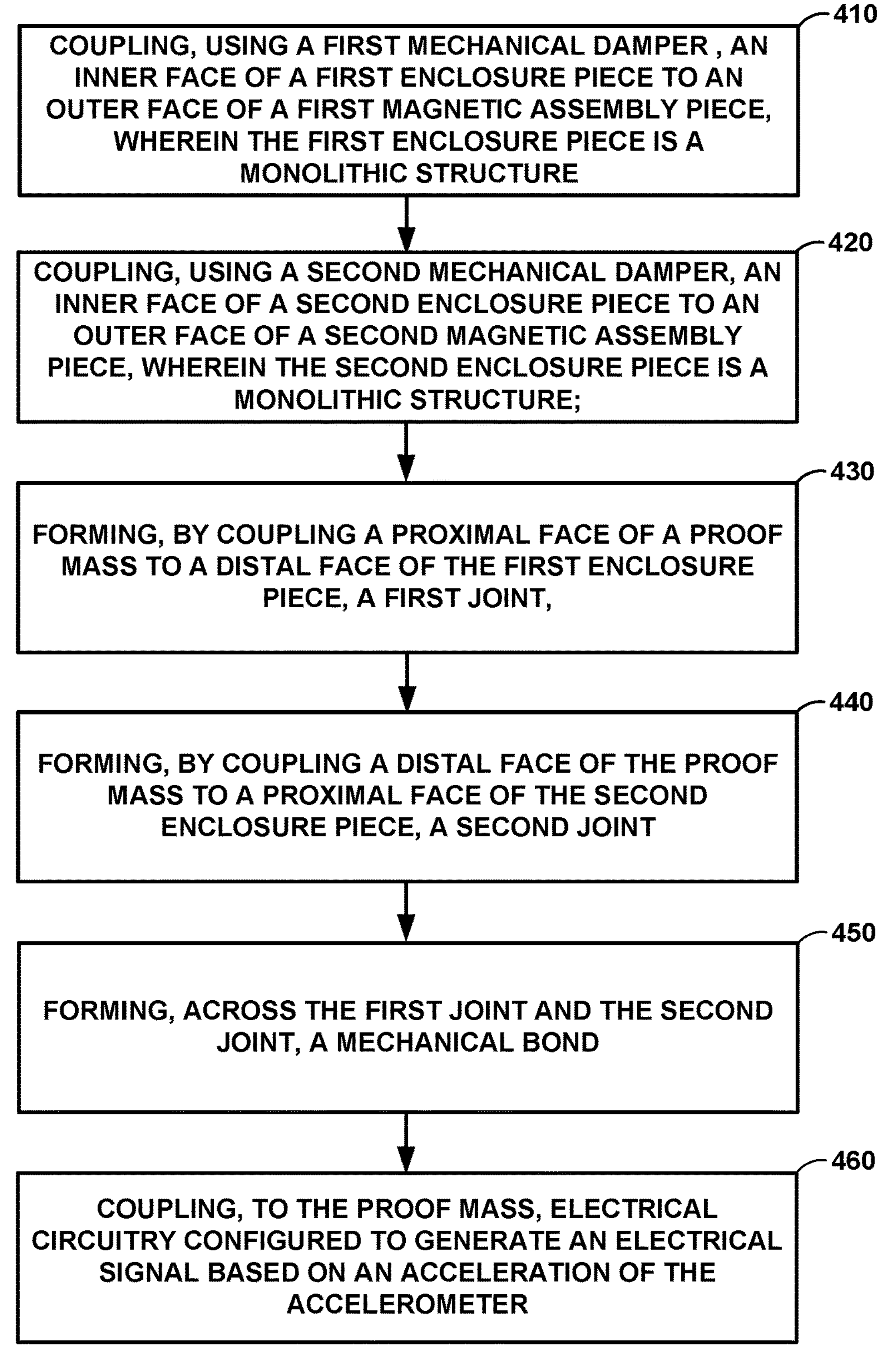
FIG. 4 is a flow diagram conceptual drawing of a three-dimensional cross-sectional view illustrating an example of an interposer used in an accelerometer, in accordance with one or more techniques of this disclosure.

FIG. 4 is a flowchart illustrating an example technique for assembling an accelerometer, in accordance with one or more techniques of the disclosure. FIG. 4 is discussed with FIGS. 1-3 for example purposes only.

Enclosure 110 may protect electrical circuitry 170 from thermal strain by assembling an accelerometer with one or more techniques of this disclosure. Assembling the accelerometer may include coupling, using a first mechanical interposer, an inner face of a first enclosure piece to an outer face of a first magnetic assembly piece, wherein the first enclosure piece is a monolithic structure (410). The first mechanical interposer may include first mechanical interposer 120A, the first enclosure piece may include first enclosure piece 110A, and the first magnetic assembly piece may include first magnetic assembly piece 130A. Coupling may include securing first mechanical interposer 120A to first magnetic assembly piece with adhesive. Coupling may also include forming first mechanical interposer 120A from a connected portion of first enclosure piece 110A.

Assembling the accelerometer may include coupling, using a second mechanical interposer, an inner face of a second enclosure piece to an outer face of a second magnetic assembly piece, wherein the second enclosure piece is a monolithic structure (420). The monolithic structure may include a piece of fused quartz that has been etched with an SLE technique to produce first enclosure piece 110A. The monolithic structure may include first enclosure piece 110A and first mechanical interposer 120A of FIG. 1.

Assembling the accelerometer may include forming, by coupling a proximal face of a proof mass to a distal face of the first enclosure piece, a first joint (430). Coupling may include using a curing adhesive with a low TCE value. In some examples, coupling may include using an SLE technique to fuse first mechanical interposer 120A to first enclosure piece 110A, of FIG. 1. Alternatively, or additionally, coupling may include using an SLE technique to etch, from a single piece of fused quartz, first enclosure piece 110A and first mechanical interposer 130A. The first joint may include first bond joint 260A. The first joint may be created by any of the SLE techniques described in FIGS. 1-3.

Assembling the accelerometer may include forming, by coupling a distal face of the proof mass to a proximal face of the second enclosure piece, a second joint (440). Coupling may include using a curing adhesive with a low TCE value. In some examples, coupling may include using an SLE technique to fuse second mechanical interposer 120B to second enclosure piece 110B, of FIG. 1. Alternatively, or additionally, coupling may include using an SLE technique to etch, from a single piece of fused quartz, second enclosure piece 110B and second mechanical interposer 130B. The second joint may include second bond joint 260B. The second joint may be created by any of the SLE techniques described in FIGS. 1-3.

Assembling the accelerometer may include forming, across the first joint and the second joint, a mechanical bond, the mechanical bond including a first bond formed using SLE across the first joint, and a second bond formed using SLE across the second joint (450). SLE techniques may include any laser etching techniques described in FIGS. 1-3.

Assembling the accelerometer may include coupling, to a torquer coil of an electrical circuitry, the proof mass configured to induce an electrical signal based on an acceleration of the accelerometer (460). Coupling may include magnetically coupling magnetic fields from first magnet 236A and second magnet 236B to torquer coil 270 of FIG B via first pole piece 234A and second pole piece 234B.

The following examples may illustrate one or more aspects of the disclosure.

Clause 1: An accelerometer comprising: a first enclosure piece having an inner face coupled, using a first mechanical interposer, to an outer face of a first magnetic assembly piece, wherein the first enclosure piece is a monolithic structure; a second enclosure piece having an inner face coupled, using a second mechanical interposer, to an outer face of a second magnetic assembly piece, wherein the second enclosure piece is a monolithic structure; a proof mass, having a proximal face, coupled to a distal face of the first enclosure piece forming a first joint, wherein the proof mass comprising a distal face coupled to a proximal face of the second enclosure piece forming a second joint; a mechanical bond formed across the first joint and the second joint; and electrical circuitry includes torquer coil coupled to the proof mass, configured to generate an electrical signal based on an acceleration of the accelerometer.

Clause 2: The accelerometer of clause 1, wherein the mechanical bond comprises a first bond formed using selective laser-induced etching (SLE) across the first joint, and a second bond formed using SLE across the second joint.

Clause 3: The accelerometer of clauses 1 or 2, wherein the mechanical bond comprises a strap having a proximal end and a distal end, wherein the proximal end of the strap is secured to a portion of the first enclosure piece and the distal end of the strap is secured to a portion of the second enclosure piece.

Clause 4: The accelerometer of clauses 1-3, wherein the material composition of each of the first enclosure piece, the second enclosure piece, and the proof mass comprises fused quartz.

Clause 5: The accelerometer of clauses 1-4, wherein coupling the first enclosure piece to the proof mass and coupling the second enclosure piece to the proof mass encapsulates a magnetic assembly, wherein the magnetic assembly comprises the first magnetic assembly piece and the second magnetic assembly piece.

Clause 6: The accelerometer of clause 5, wherein the electrical circuitry comprises a torquer coil coupled to the proof mass, wherein the torquer coil is circumferentially wrapped around a portion of the first magnetic assembly piece and wherein the torquer coil is circumferentially wrapped around a portion of the second magnetic assembly piece when encapsulated by an enclosure, wherein the enclosure comprises the first enclosure piece and the second enclosure piece.

Clause 7: The accelerometer of clauses 1-6, wherein each of the first mechanical interposer and the second mechanical interposer comprises a plurality of pillar structures connecting a first side of the mechanical interposer to a second side of the mechanical interposer, wherein the pillar structures are configured to flex when compression is applied between the first side and the second side.

Clause 8: The accelerometer of clause 7, wherein each of the first mechanical interposer and the second mechanical interposer is configured to conduct electrical signals from the first side of the mechanical interposer to the second side of the mechanical interposer as an electrical interposer.

Clause 9: The accelerometer of clauses 1-8, wherein each of the first mechanical interposer and the second mechanical interposer is created by performing SLE on a piece of fused quartz.

Clause 10: The accelerometer of clauses 1-9, wherein the first mechanical interposer and first enclosure piece form a first monolithic structure and the second interposer, and the second enclosure piece form a second monolithic structure.

Clause 11: The accelerometer of clauses 1-10, wherein the mechanical bond comprises a material having a low thermal coefficient of expansion (TCE).

Clause 12: The accelerometer of clauses 1-11, wherein the proof mass refrains from mechanically contacting the first magnetic assembly piece and the proof mass refrains from mechanically contacting the second magnetic assembly piece.

Clause 13: The accelerometer of clauses 1-12, wherein the first magnetic assembly piece includes a first pole piece coupled to a first magnet, coupled to a first piece of invar and the second magnetic assembly piece includes a second pole piece coupled to a second magnet, coupled to a second piece of invar.

Clause 14: The accelerometer of clauses 1-13, wherein the inner face of the first enclosure piece is a distal inner face, and the outer face of the first magnetic assembly piece is a proximal outer face, and wherein the inner face of the second enclosure piece is a proximal inner face, and the outer face of the second magnetic assembly piece is a distal outer face.

Clause 15: The accelerometer of clauses 1-14, wherein the inner face of the first enclosure piece is a first lateral inner face, the outer face of the first magnetic assembly piece is a first lateral outer face, the inner face of the second enclosure piece is a lateral second inner face and the outer face of the second magnetic assembly piece is a second lateral outer face.

Clause 16: The accelerometer of clauses 1-15, wherein the proof mass comprises on outer ring connected to an inner portion by a flexure, wherein the outer ring is coupled to the first enclosure piece and further coupled to the second enclosure piece.

Clause 17: The accelerometer of clause 16, wherein the flexure is configured to allow the inner portion to bend in relation to the outer ring about the flexure.

Clause 18: The accelerometer of clauses 1-17, wherein the first enclosure piece comprises a first plurality of pieces bonded together, and the second enclosure piece comprises a second plurality of pieces bonded together, wherein in each piece of the first plurality comprises a first shared material and each piece of the second plurality comprises a second shared material.

Clause 19: The accelerometer of clauses 17, wherein the flexure of the proof mass is configured to electrically conduct, across the flexure, the electrical signals generated by the torquer coil coupled to the inner portion of the proof mass to the outer ring of the proof mass.

Clause 20: A method of manufacturing an accelerometer, the method comprising: coupling, using a first mechanical interposer, an inner face of a first enclosure piece to an outer face of a first magnetic assembly piece, wherein the first enclosure piece is a monolithic structure; coupling, using a second mechanical interposer, an inner face of a second enclosure piece to an outer face of a second magnetic assembly piece, wherein the second enclosure piece is a monolithic structure; forming, by coupling a proximal face of a proof mass to a distal face of the first enclosure piece, a first joint; forming, by coupling a distal face of the proof mass to a proximal face of the second enclosure piece, a second joint; forming, across the first joint and the second joint, a mechanical bond; wherein the mechanical bond comprises a first bond formed using selective laser-induced etching (SLE) across the first joint, and a second bond formed using SLE across the second joint; and coupling, to a torquer coil of an electrical circuitry, the proof mass configured to induce an electrical signal based on an acceleration of the accelerometer.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. An accelerometer comprising:

a first enclosure piece having an inner face coupled, using a first mechanical interposer, to an outer face of a first magnetic assembly piece, wherein the first enclosure piece is a monolithic structure;

a second enclosure piece having an inner face coupled, using a second mechanical interposer, to an outer face of a second magnetic assembly piece, wherein the second enclosure piece is a monolithic structure;

a proof mass, having a proximal face, coupled to a distal face of the first enclosure piece forming a first joint, wherein the proof mass comprising a distal face coupled to a proximal face of the second enclosure piece forming a second joint;

a mechanical bond formed across the first joint and the second joint; and electrical circuitry includes torquer coil coupled to the proof mass, configured to generate an electrical signal based on an acceleration of the accelerometer.

2. The accelerometer of claim 1, wherein the mechanical bond comprises a first bond formed using laser bonding across the first joint, and a second bond formed using laser bonding across the second joint.

3. The accelerometer of claim 1, wherein the mechanical bond comprises a strap having a proximal end and a distal end, wherein the proximal end of the strap is secured to a portion of the first enclosure piece and the distal end of the strap is secured to a portion of the second enclosure piece.

4. The accelerometer of claim 1, wherein each of the first enclosure piece, the second enclosure piece, and the proof mass comprises fused quartz.

5. The accelerometer of claim 1, wherein coupling the first enclosure piece to the proof mass and coupling the second enclosure piece to the proof mass encapsulates a magnetic assembly, wherein the magnetic assembly comprises the first magnetic assembly piece and the second magnetic assembly piece.

6. The accelerometer of claim 5, wherein the electrical circuitry comprises a torquer coil coupled to the proof mass, wherein the torquer coil is circumferentially wrapped around a portion of the first magnetic assembly piece and wherein the torquer coil is circumferentially wrapped around a portion of the second magnetic assembly piece when encapsulated by an enclosure, wherein the enclosure comprises the first enclosure piece and the second enclosure piece.

7. The accelerometer of claim 1, wherein each of the first mechanical interposer and the second mechanical interposer comprises a plurality of pillar structures connecting a first side of the mechanical interposer to a second side of the mechanical interposer, wherein the pillar structures are configured to flex when compression is applied between the first side and the second side.

8. The accelerometer of claim 7, wherein each of the first mechanical interposer and the second mechanical interposer is configured to conduct electrical signals from the first side of the mechanical interposer to the second side of the mechanical interposer as an electrical interposer.

9. The accelerometer of claim 1, wherein each of the first mechanical interposer and the second mechanical interposer is created by performing selective laser-induced etching (SLE) on a piece of fused quartz.

10. The accelerometer of claim 1, wherein the first mechanical interposer and first enclosure piece form a first monolithic structure and the second interposer, and the second enclosure piece form a second monolithic structure.

11. The accelerometer of claim 1, wherein the mechanical bond comprises a material having a low thermal coefficient of expansion (TCE).

12. The accelerometer of claim 1, wherein the proof mass refrains from mechanically contacting the first magnetic assembly piece and the proof mass refrains from mechanically contacting the second magnetic assembly piece.

13. The accelerometer of claim 1, wherein the first magnetic assembly piece includes a first pole piece coupled to a first magnet, coupled to a first piece of invar and the second magnetic assembly piece includes a second pole piece coupled to a second magnet, coupled to a second piece of invar.

14. The accelerometer of claim 1, wherein the inner face of the first enclosure piece is a distal inner face, and the outer face of the first magnetic assembly piece is a proximal outer face, and wherein the inner face of the second enclosure piece is a proximal inner face, and the outer face of the second magnetic assembly piece is a distal outer face.

15. The accelerometer of claim 1, wherein the inner face of the first enclosure piece is a first lateral inner face, the outer face of the first magnetic assembly piece is a first lateral outer face, the inner face of the second enclosure piece is a lateral second inner face and the outer face of the second magnetic assembly piece is a second lateral outer face.

16. The accelerometer of claim 1, wherein the proof mass comprises an outer ring connected to an inner portion by a flexure, wherein the outer ring is coupled to the first enclosure piece and further coupled to the second enclosure piece.

17. The accelerometer of claim 16, wherein the flexure is configured to allow the inner portion to bend in relation to the outer ring about the flexure.

18. The accelerometer of claim 1, wherein the first enclosure piece comprises a first plurality of pieces bonded together, and the second enclosure piece comprises a second plurality of pieces bonded together, wherein in each piece of the first plurality comprises a first shared material and each piece of the second plurality comprises a second shared material.

19. The accelerometer of claim 17, wherein the flexure of the proof mass is configured to electrically conduct, across the flexure, the electrical signals generated by the torquer coil coupled to the inner portion of the proof mass to the outer ring of the proof mass.

20. A method of manufacturing an accelerometer, the method comprising:

coupling, using a first mechanical interposer, an inner face of a first enclosure piece to an outer face of a first magnetic assembly piece, wherein the first enclosure piece is a monolithic structure;

coupling, using a second mechanical interposer, an inner face of a second enclosure piece to an outer face of a second magnetic assembly piece, wherein the second enclosure piece is a monolithic structure;

forming, by coupling a proximal face of a proof mass to a distal face of the first enclosure piece, a first joint;

forming, by coupling a distal face of the proof mass to a proximal face of the second enclosure piece, a second joint;

forming, across the first joint and the second joint, a mechanical bond; wherein the mechanical bond comprises a first bond formed using laser bonding across the first joint, and a second bond formed using laser bonding across the second joint; and coupling, to a torquer coil of an electrical circuitry, the proof mass configured to induce an electrical signal based on an acceleration of the accelerometer.

* * * * *